(12) United States Patent
Ramaswami (10) Patent No.: US 10,475,840 B1
(45) Date of Patent: Nov. 12, 2019

(54) IMAGING ARRAY HAVING IMPROVED SURFACE-TO-DETECTOR LIGHT TRANSMISSION

(71) Applicant: Foveon, Inc., San Jose, CA (US)

(72) Inventor: Shrinath Ramaswami, San Jose, CA (US)

(73) Assignee: Foveon, Inc., San Jose, CA (US)

( * ) Notice: Subject to any disclaimer, the term of this patent is extended or adjusted under 35 U.S.C. 154(b) by 0 days.

(21) Appl. No.: 16/150,211

(22) Filed: Oct. 2, 2018

(51) Int. Cl.
*H01L 31/062* (2012.01)
*H01L 27/146* (2006.01)

(52) U.S. Cl.
CPC .... *H01L 27/1463* (2013.01); *H01L 27/14603* (2013.01); *H01L 27/14627* (2013.01); *H01L 27/14632* (2013.01); *H01L 27/14636* (2013.01); *H01L 27/14645* (2013.01)

(58) Field of Classification Search
CPC ............. H01L 27/146; H01L 27/14603; H01L 27/14627; H01L 27/14632; H01L 27/14636; H01L 27/14645
See application file for complete search history.

(56) References Cited

U.S. PATENT DOCUMENTS

| | | | | |
|---|---|---|---|---|
| 2009/0065827 | A1* | 3/2009 | Hwang | H01L 27/1463 257/292 |
| 2016/0163749 | A1* | 6/2016 | Yang | H01L 27/1463 257/446 |
| 2017/0358620 | A1* | 12/2017 | Chen | H01L 27/14643 |
| 2018/0254294 | A1* | 9/2018 | Cheng | H01L 27/1463 |

OTHER PUBLICATIONS

"Image Sensors for Mobile Use: SmartFSI®," https://industrial.panasonic.com/ww/products/semiconductors/imagesensors/mobile, date unavailable.
Tzu-Hsuan, et al., "High-Efficiency Dielectric Structure for Advanced CMOS Imagers", VLSI Technology Laboratory, Institute of Microelectronics, Department of Electrical Engineering, National Cheng Kung University, Tainan, Taiwan, R.O.C., date unknown.

* cited by examiner

*Primary Examiner* — Phuc T Dang
(74) *Attorney, Agent, or Firm* — Glass and Associates; Kenneth Glass; Kenneth D'Alessandro (57) ABSTRACT

A pixel sensor array includes a plurality of surface pixel sensors disposed in a substrate, a layer of dielectric material formed over the surface of the pixel sensors, a plurality of apertures formed in the dielectric layer each aligned with one of the surface pixel sensors and having an inner side wall. A lining layer is formed on the inner side wall of each aperture and is substantially fully reflective to visible light. The lining layer is spaced apart from the surface of the substrate and has a smaller cross-sectional area than a cross-sectional area of each surface pixel sensor. A filler material substantially transparent to visible light is disposed inside of the reflective lining layer and has a top surface lying in the plane with the top surface of the layer of dielectric material. A microlens is disposed over the top surface of each aperture.

18 Claims, 9 Drawing Sheets

IMAGING ARRAY HAVING IMPROVED SURFACE-TO-DETECTOR LIGHT TRANSMISSION

BACKGROUND

The present relates to imaging array integrated circuits. More particularly, the present invention relates to imaging arrays having improved transmission of light from an upper surface to the detector regions of the integrated circuit.

As digital cameras become thinner, the angles of light irradiating the individual pixel sensors in the imaging array become larger as measured normal to the surface. Designers have employed several techniques to accommodate these angles.

According to one possible solution, the pixel sensors that make up the array can be increased in size at the cost of decreasing resolution. This is generally not considered to be a satisfactory solution in view of the trend to increase rather than decrease the resolution of digital cameras.

In very small pixels, such as those used for cell-phone camera sensors, a "light pipe" has been employed. This is similar in concept to a fiber optic cable, relying upon total internal reflection (TIR). It therefore requires the use of a high-index polymer as the core of the light pipe. The concept will work well for small incident angles (steep angle of incidence on the sidewall), but it becomes progressively less useful as incident angles increase. According to one particular prior-art light-pipe solution depicted in FIG. 1, light pipes employing internal reflection at the edges of lenses are positioned over the pixel sensors. Adjacent pixel sensors 10a and 10b are shown formed in p-type substrate (or well) 12. Dielectric layer 14 is formed over the pixel sensors 10a and 10b and vias are formed, respectively over and in alignment with pixel sensors 10a and 10b and are both filled with a polymer to form light pipes (indicated at reference numerals 16a and 16b) having a high index of refraction (e.g., n≅1.6). Lenses 18a and 18b are formed on the surface of the dielectric layer as is known in the art. A layer of material (shown by reference numerals 20) provides total internal reflection is formed at the edges of the lenses 18a and 18b between adjacent pixel areas.

Figure 1:
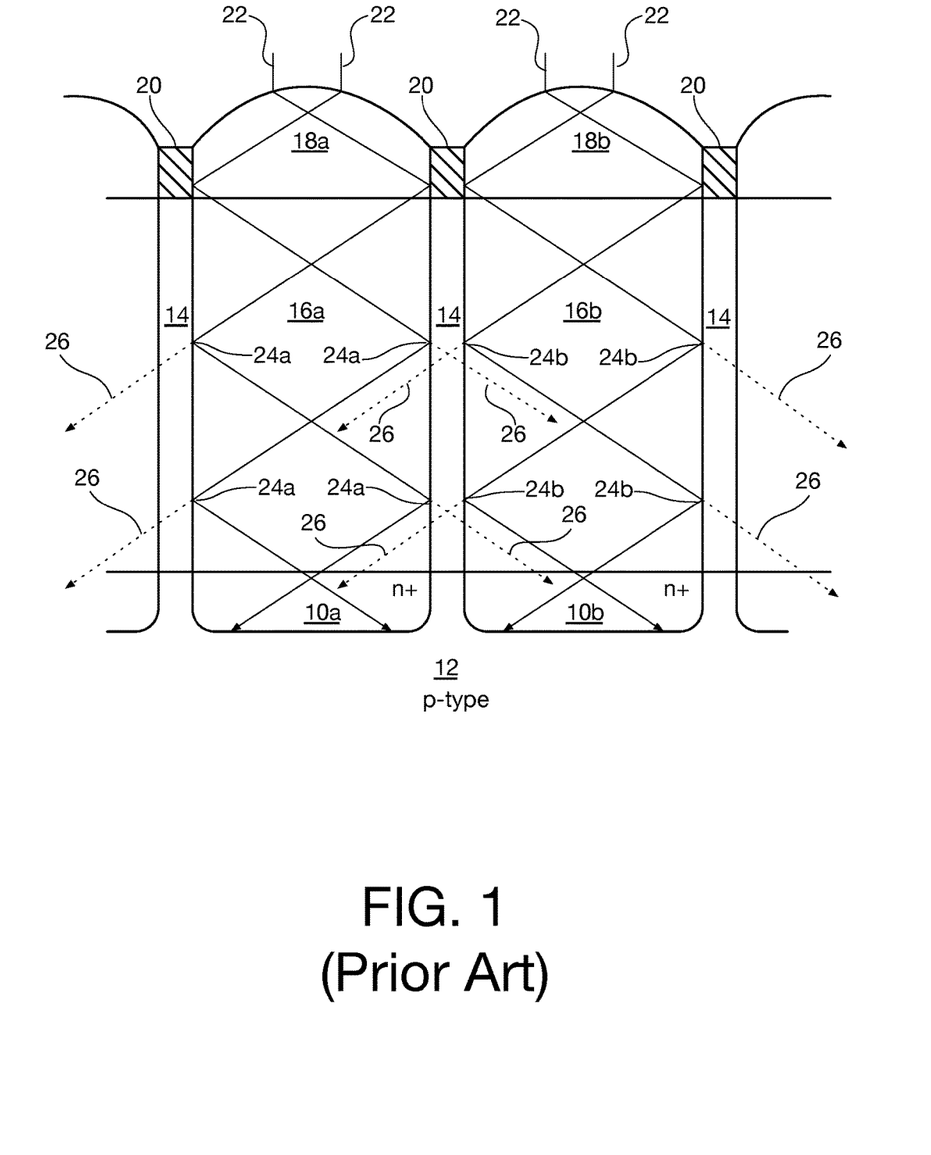
FIG. 1 is a cross sectional diagram of a portion of an imaging array depicting one prior-art solution to the problem of capturing light impinging on the array at increased angles.

Light rays directed at the surface of the pixel sensor array containing pixel sensors 10a and 10b, two of which are shown symbolically at reference numerals 22. As shown in FIG. 1, the light rays bend at the interface of the lenses 18a and 18b. The light rays 22 are also shown reflecting from the layer 20 at the edges of the lenses. Without the presence of the layers of material 20, these light rays 22 would continue along a path that would lead into the next adjacent pixel but the presence of the layer of reflective material 20 reflects them back into the pixel area into which they entered.

As the light rays 22 continue downward from the lens into the polymer layers 16a and 16b, they are reflected by the interface (shown at reference numerals 24a and 24b) between the respective polymer layers 16a and 16b and the dielectric layer 14 (having an index of refraction of about n=1.53) in which they are formed. This interface is not 100% reflective and so some of the light shown at reference numerals 26 passes through the interface, through the dielectric layer separating the two adjacent pixels, and undesirably into adjacent pixel sensors causing undesirable crosstalk.

Figure 2:
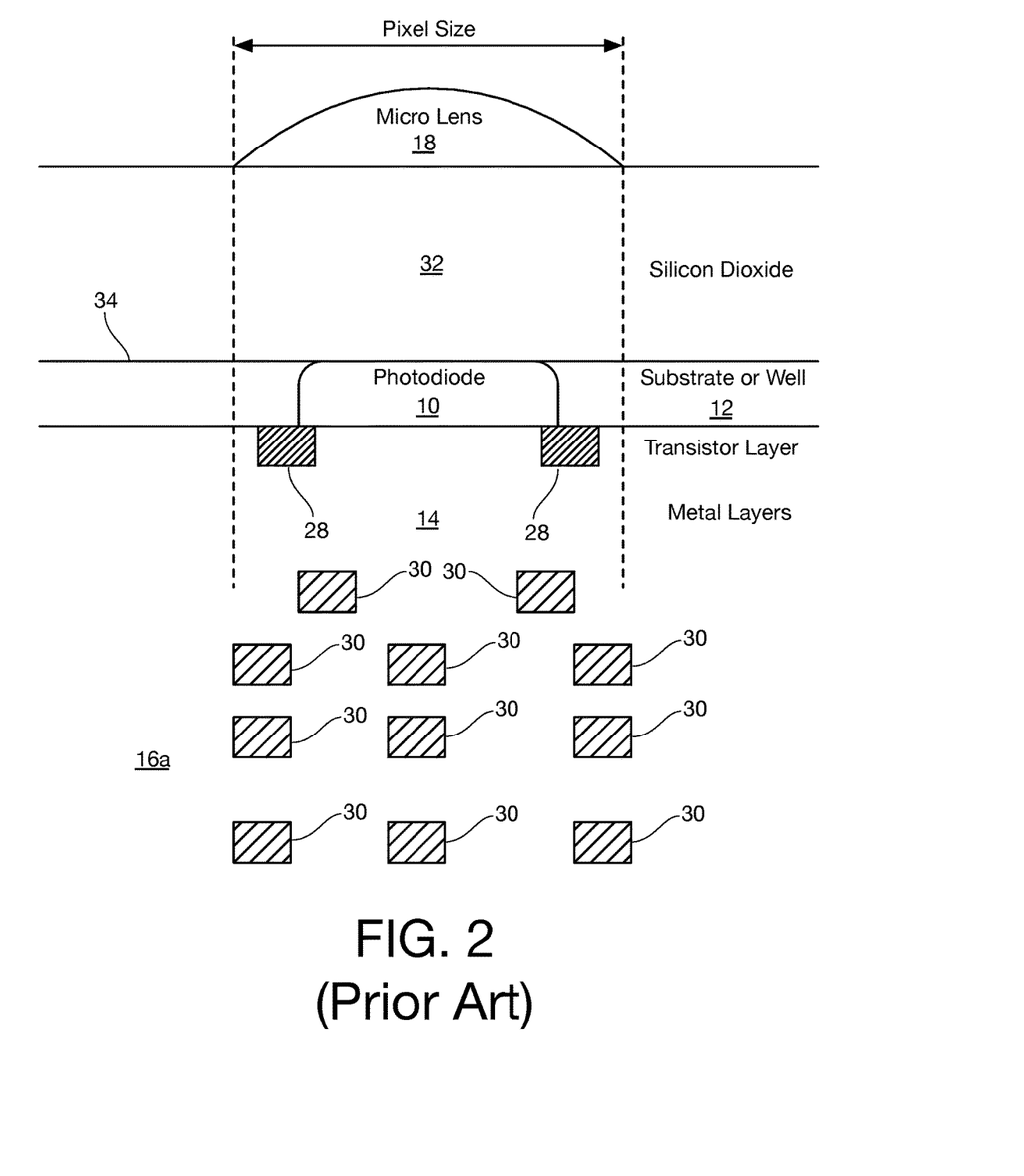
FIG. 2 is a cross sectional diagram of a portion of an imaging array depicting another prior-art solution to the problem of capturing light impinging on the array at increased angles.

According to another particular prior-art solution depicted in FIG. 2, back-side illumination (BSI) has been used. In this embodiment, which is shown in a vertical orientation opposite to the orientation of FIG. 1, a typical photodiode pixel sensor 10 is shown formed in substrate or well 12. Dielectric layer 14 formed over the pixel sensor 10 includes transistor diffusions 28 and metal interconnect segments 30 both shown at arbitrary locations for purposes of illustration only.

The microlens 18 for the pixel sensor 10 is formed over a silicon dioxide layer 32 on the backside 34 of the silicon wafer on which the pixel sensor is fabricated. The silicon dioxide layer 32 is much thinner than the dielectric layer 14 of the prior-art example shown in FIG. 1, and therefore accepts light from a relatively large angle.

All of these techniques have disadvantages. Ideally, it would be desirable for a small pixel to have the same acceptance angles as a large pixel without the drawbacks of the present solutions.

BRIEF DESCRIPTION

According to a first aspect of the present invention, a pixel sensor array includes a plurality of surface pixel sensors disposed in a substrate, a layer of dielectric material formed over the surface of the pixel sensors, a plurality of apertures formed in the dielectric layer each aligned with one of the surface pixel sensors and having an inner side wall. A lining layer is formed on the inner side wall of each aperture and is substantially fully reflective to visible light. The lining layer is spaced apart from the surface of the substrate and has a smaller cross-sectional area than a cross-sectional area of each surface pixel sensor. A filler material substantially transparent to visible light is disposed inside of the reflective lining layer and has a top surface lying in the plane with the top surface of the layer of dielectric material. A microlens is disposed over the top surface of each aperture.

According to an aspect of the invention the pixel sensing layer is a layer of silicon doped with a dopant species having a first conductivity type, and each surface pixel sensing element is a photodiode formed at the surface of the layer of silicon. Each photodiode has an anode formed from a region of silicon doped with a dopant species having a second conductivity type opposite the first conductivity type.

According to another aspect of the invention the pixel sensor array also includes a first subsurface pixel sensing element disposed in the pixel sensing layer below, in alignment with, and insulated from the surface pixel sensing element, and a second subsurface pixel sensing element disposed in the pixel sensing layer below, in alignment with, and insulated from the first subsurface pixel sensing element.

According to another aspect of the present invention, the reflective lining layer is formed from an Al—Cu metal layer.

According to another aspect of the present invention, the filler material is formed from a polymer or from a dielectric material such as silicon dioxide.

According to another aspect of the present invention, the inner wall of each reflective lining layer is tapered from a larger cross-sectional area at the top surface thereof to a smaller cross-sectional area at a bottom surface thereof.

According to another aspect of the present invention, each aperture is aligned with one of the surface pixel sensing elements within a predetermined tolerance.

According to another aspect of the present invention, the reflective lining layer is capacitively coupled to a low-resistance metal layer biased at one of the power supply voltages in the integrated circuit containing the pixel sensor array.

BRIEF DESCRIPTION OF THE DRAWING FIGURES

The invention will be explained in more detail in the following with reference to embodiments and to the drawing in which are shown.

DETAILED DESCRIPTION

Persons of ordinary skill in the art will realize that the following description of the present invention is illustrative only and not in any way limiting. Other embodiments of the invention will readily suggest themselves to such skilled persons.

Figure 3:
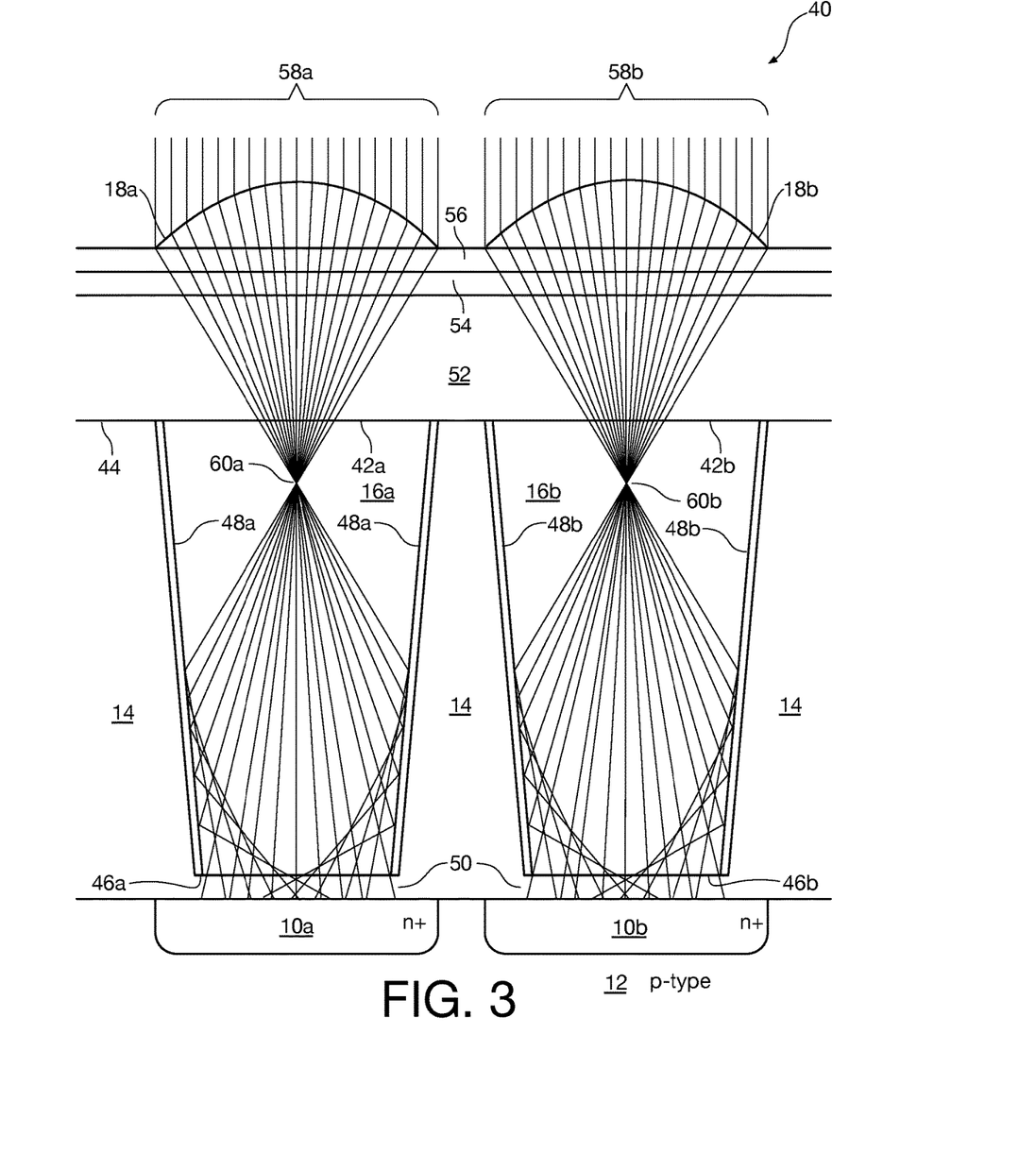
FIG. 3 is a cross sectional diagram of a portion of an imaging array depicting a solution to the problem of capturing light impinging on the array at increased angles in accordance with an aspect of the present invention.

Referring now to FIG. 3 a portion 40 of an illustrative array of pixel sensors is depicted showing a pair of surface pixel sensors 10a and 10b in accordance with one aspect of the present invention formed on a substrate 12. The substrate is shown in FIG. 3 as a p-type substrate and the surface pixel sensors 10a and 10b are n-type regions disposed in the p-type substrate forming the anodes of photodiodes as is known in the art, the substrate forming the cathodes of the photodiodes. Persons of ordinary skill in the art will appreciate that the p-type substrate may be a p-well formed in an underlying semiconductor substrate. Such skilled persons will also appreciate that while the portion of the array 40 depicted in FIG. 3 shows only two pixel sensors 10a and 10b, any array actually fabricated according to the principles of the present invention may include an arbitrary number of pixel sensors.

A first interlayer dielectric layer 14 is formed over the surface of the substrate 12 and the n-type regions forming the surface pixel sensors 10a and 10b. Vias are formed to function as light pipes 16a and 16b. as presently preferred, the light pipes 16a and 16b are tapered, having a larger cross-sectional area at top ends 42a and 42b that are planar with the top surface 44 of the first interlayer dielectric layer 14 than at bottom ends 46a and 46b. The cross-sectional area of the bottom ends 46a and 46b of the light pipes 16a and 16b is smaller than the cross-sectional area of the pixel sensors 10a and 10b and are substantially centered over the pixel sensors 10a and 10b. The bottom ends 46a and 46b of the light pipes 16a and 16b are spaced apart from the top surface of the substrate.

Although providing a vertical sidewall is conceptually simpler, it has several practical disadvantages. The most important disadvantage is that it limits the view angle at the top of the light pipe, which necessitates a larger pixel size and/or places very stringent restrictions on process control. In view of these disadvantages, a tapered design is preferred.

According to one aspect of the present invention, a process to form the tapered vias forming the light pipes 16a and 16b employs an etch chemistry that includes fluorine (F) to etch the $SiO_2$ and chemistry to create an organic polymer to deposit on the etched sidewall to protect it. The fluorine etches the bottom of the via while the polymer is deposited on its sidewalls to protect them from the etching process. At each interval of time $\Delta t$ the $SiO_2$ is etched down a distance $\Delta y$ and a polymer having a thickness $\Delta x$ is deposited on the sidewall. By controlling the amount of F and polymer, the degree of taper is controlled. Since processes differ from foundry to foundry, routine testing may be employed to achieve the desired degree of taper in any given process.

A typical plasma etch chemistry that may include $CF_4$ which acts as the main source of F, $CHF_3$ which is the main source of hydrocarbon polymers $C_xH_y, \ldots C_xH_yF_z$, and Ar which acts as a carrier gas and as a source of ions.

The light pipes 16a and 16b are each lined with reflective lining layers shown at reference numerals 48a and 48b.

The light pipe in the present invention may be formed in one of two ways. According to one aspect of the present invention, where the first interlayer dielectric layer 14 is formed from silicon dioxide ($SiO_2$), the light pipe via may be filled with a filler material that is substantially transparent in the visible spectrum. Examples of suitable filler materials include dielectric materials like $SiO_2$, or a polymer having an index of refraction higher than the surrounding the first silicon dioxide interlayer dielectric layer 14.

To form a good reflective surface on the sidewall of the light pipes 16a and 16b, the reflective lining layer shown at reference numerals is deposited to line the inner wall of the light pipe must exhibit good reflection over the entire visible wavelength range, i.e., it is preferred that it have a silvery appearance. It is preferred that the reflective lining layer be a metal lining layer and has a smooth surface because rough surfaces are known to scatter light, and what is preferred is a surface having a high specular reflection. The thickness of the metal layer must be sufficient to prevent light from penetrating the sidewall to avoid cross-talk between pixel sensors at larger incident angles and also thick enough to avoid pinhole defects.

In accordance with one aspect of the present invention, an Al—Cu metallization material commonly used in CMOS processes as a metallization interconnect layer has the required properties. Tungsten metallization is also currently in use but has a dull gray appearance and an unacceptably large surface roughness which result in poor reflectivity.

At light wavelengths of 750 nm the theoretical minimum Al—Cu thickness for a light transmission attenuation of 10e6 is about 0.028 µm, however, this is likely to be insufficient because the resistivity of an Al—Cu thin film may be higher than the bulk resistivity and films having thicknesses in this range are known to have pinholes. It is a minimum thickness for Al—Cu films is at least about 0.14 µm. Further, because the step coverage of plasma vapor deposited (PVD) Al—Cu is relatively poor, a sputter thickness of about 0.24 µm at the top ends 42a and 42b is presently preferred, which results in a minimum thickness of about 0.14 µm at the bottom ends 46a and 46b of the light pipes 16a and 16b.

In one exemplary non-limiting embodiment, the top ends 42a and 42b of the light pipes are chosen to provide a minimum photoresist width between adjacent light pipe openings of 0.8 µm). In an exemplary embodiment where a pixel sensor size of 4.15 µm is assumed, this gives a top dimension of 4.15−0.8=3.35 µm.

In a tapered light pipe design the bottom of the light pipe has to be smaller than the dimensions of the top surface of the photodiode, which, in a non-limiting example, assumed to be about 2.8 µm active. As an example, if active enclosure of the light pipe is taken as 0.2 µm, the bottom width can be determined=2.8−0.4=2.4 µm.

The length of the light pipe is not critical for the optics design, providing considerable freedom to choose it. It is advantageous to have a thicker back-end-of-line (BEOL) for additional metal layers. In one exemplary embodiment, the thickness of the interlayer dielectric layer 14 is chosen to be about 6 µm, which allows the inclusion of four metal interconnect layers within the interlayer dielectric layer 14.

Given the above parameters, the sidewall angle will be, nominally, about 3.6°. Persons of ordinary skill in the art will appreciate that a thicker first interlayer dielectric layer 14 will reduce the angle further; however, increasing the thickness of the first interlayer dielectric layer 14 from 6 µm to 7 µm only reduces the sidewall angle by 0.5°, which does not provide much of an advantage, and increases the aspect ratio of the via forming the light pipes 16a and 16b.

A base layer 50 is interposed to separate the bottoms of the light pipes 16a and 16b from the surfaces of the pixel sensors 10a and 10b. It would be optically advantageous if the light pipe extended all the way down to the silicon surface. However, this would cause damage in the silicon, result in excess dark current, and may even etch into the silicon. In addition, if the metal material from which the reflective liner is made comes into contact with the upper surface of the pixel sensor, the thermal budget of subsequent process steps will cause metal ions to diffuse into and severely damage the pixel sensor layer, rendering the pixel sensors 10a and 10b inoperative. The base layer is composed of residual $SiO_2$ from the first interlayer dielectric layer that is left unetched below the bottom ends 46a and 46b If the thickness of the base layer 50 is too large, light will be permitted to escape under the metal and fall outside the active areas of the pixel sensors 10a and 10b, especially at larger angles, decreasing the efficiency of the light capture.

In one exemplary embodiment. at an incident angle of 40°, the light entering the light pipe has a maximum angle of 55°. The thickness of the base layer is chosen to allow no more than 1% of light falling outside the active pixel sensor area, allowing for 0.1 µm of mis-alignment between the active pixel sensor area and the light pipe. Simulations have shown that with zero misalignment between the active pixel sensor area and the light pipe, no light falls outside of the active pixel sensor area and with a misalignment of 0.1 µm 0.6% of the light falls outside of the active pixel sensor area. Based on simulation results, a thickness of about 0.1 µm for the base layer 50 has been found to be satisfactory. If a base layer thickness of 0.2 µm is used, simulation results have shown that with zero misalignment between the active pixel sensor area and the light pipe, 6.4% of the light falls outside of the active pixel sensor area and with a misalignment of 0.1 µm 11.7% of the light falls outside of the active pixel sensor area.

A second interlayer dielectric layer 52 is disposed over the top of first interlayer dielectric layer 14 and the planarized tops of the reflective lining layers 44a and 44b as and the top of the filler material in each of the light pipes 16a and 16b. In one exemplary embodiment, this second interlayer dielectric layer 50 may have a thickness of about 2.5 µm and at that thickness can support two layers of metal interconnect.

A passivation layer 54 is formed over the top surface of the second interlayer dielectric layer 52 and a planarization layer 56 is formed over the top surface of the passivation layer 54. In one exemplary embodiment, the thickness of the passivation layer 54 may be about 0.3 µm and the thickness of the planarization layer 56 may be about 0.4 µm. These layers may be formed from, for example, deposited silicon dioxide.

FIG. 3 shows a plurality of light rays 58a and 58b entering pixel sensors 10a and 10b through microlenses 18a and 18b respectively. The focal lengths of microlenses 18a and 18b are chosen to position the focal points of the light rays at positions 60a and 60b respectively. Persons of ordinary skill in the art will note that the positions of focal points 60a and 60b are located within the lightpipes 16a and 16b. Accordingly and as may be seen in FIG. 3, all incoming light rays 58a and 58b diverging past the focal points 60a and 60b strike the pixel sensors 10a and 10b, either directly or after reflection from the reflective lining layers 48a and 48b.

Figure 4A:
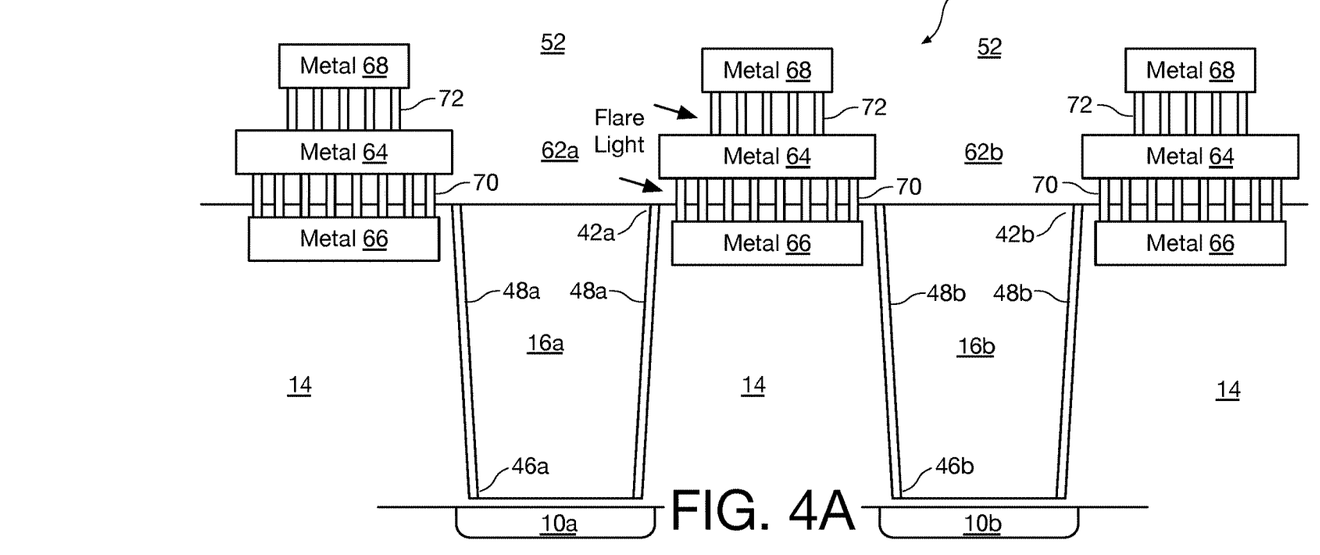
FIGS. 4A and 4B are cross sectional diagram of a portion of an imaging array illustrating structures for eliminating the effects of flare light in pixel sensors in accordance with an embodiment of the present invention.
Figure 4B:
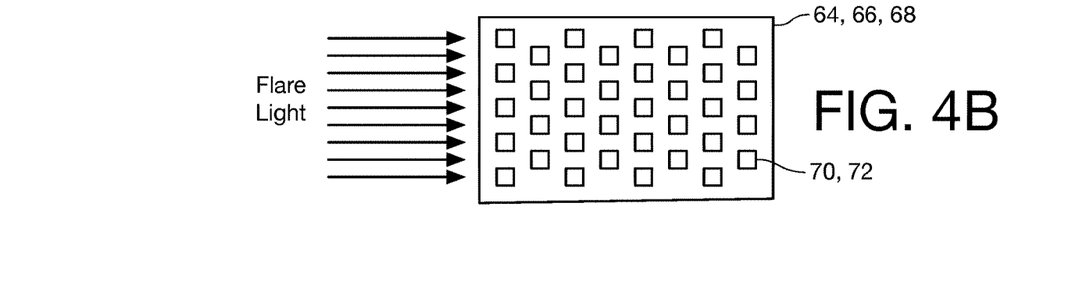

Referring now to FIG. 4A and FIG. 4B, two diagrams illustrate structures for eliminating the effects of flare light in pixel sensor in accordance with an embodiment of the present invention. FIG. 4A is a cross-sectional view of an adjacent pair of lightpipe structures 16a and 16b. Persons of ordinary skill in the art will appreciate that layers 54, 56 and microlenses 18a and 18b are present in the structure depicted in FIG. 4A, but are omitted from the drawing figure.

Flare in the lens and camera can result in incident angles for incoming light in the range of from about 70° to about 75°. In conventional optical designs, it is not possible to protect the pixel sensor against flare light, but in accordance with an aspect of the present invention there are some measures that can be taken to suppress flare light. The effect of flare light has to be considered both at the top ends 42a and 42b and at the bottom ends 46a and 46b of the light pipes 16a and 16b. As noted above, at the bottom ends 46a and 46b of the light pipes 16a and 16b, flare can be minimized by using a thin base layer, i.e., a thickness of about 0.1 µm for a lightpipe having the dimensions recited herein in the exemplary embodiment discussed above. Up to 15% of flare light can fall outside the active pixel sensor area but should not be a problem since the amount of flare light captured in in any single pixel sensor 10a or 10b is a small fraction of total light.

As shown in FIG. 4A, openings 62a and 62b in metal interconnect layer 64 formed in the second interlayer dielectric layer 52 define the optical apertures for the pixel sensors 10a and 10b. A structure for minimizing flare light can include a metal layer 66 formed in the first interlayer dielectric region 14 and a metal layer 68 formed in the second interlayer dielectric layer 52. Openings in metal layers 66 and 68 are wider than openings 62a and 62b in metal interconnect layer 64 and do not affect the optical apertures for the pixel sensors 10a and 10b.

A dense array of intermetal vias, one of which is indicated at reference numeral 70, may be employed between metal interconnect layer 64 and metal interconnect layer 66 in regions between adjacent pixel sensors to block flare light. Similarly, a plurality of intermetal vias, one of which is indicated at reference numeral 72, are formed between metal interconnect layer 64 and metal interconnect layer 68 in regions between adjacent pixel sensors. FIG. 4B shows a top view of an illustrative one of the vertical structures showing the layout of the interconnect vias 70 and 72. The vias 70 and 72, respectively, are laterally positioned so that flare light indicated by arrows as entering from the left side of FIG. 4B is effectively blocked from passing between any of the metal interconnect layer segments 64, 66, and 68 that make up any of the vertical structures. The multiple sheets of metal interconnect layers 64, 66, and 68, are all tied to Vpix.

Figure 5:
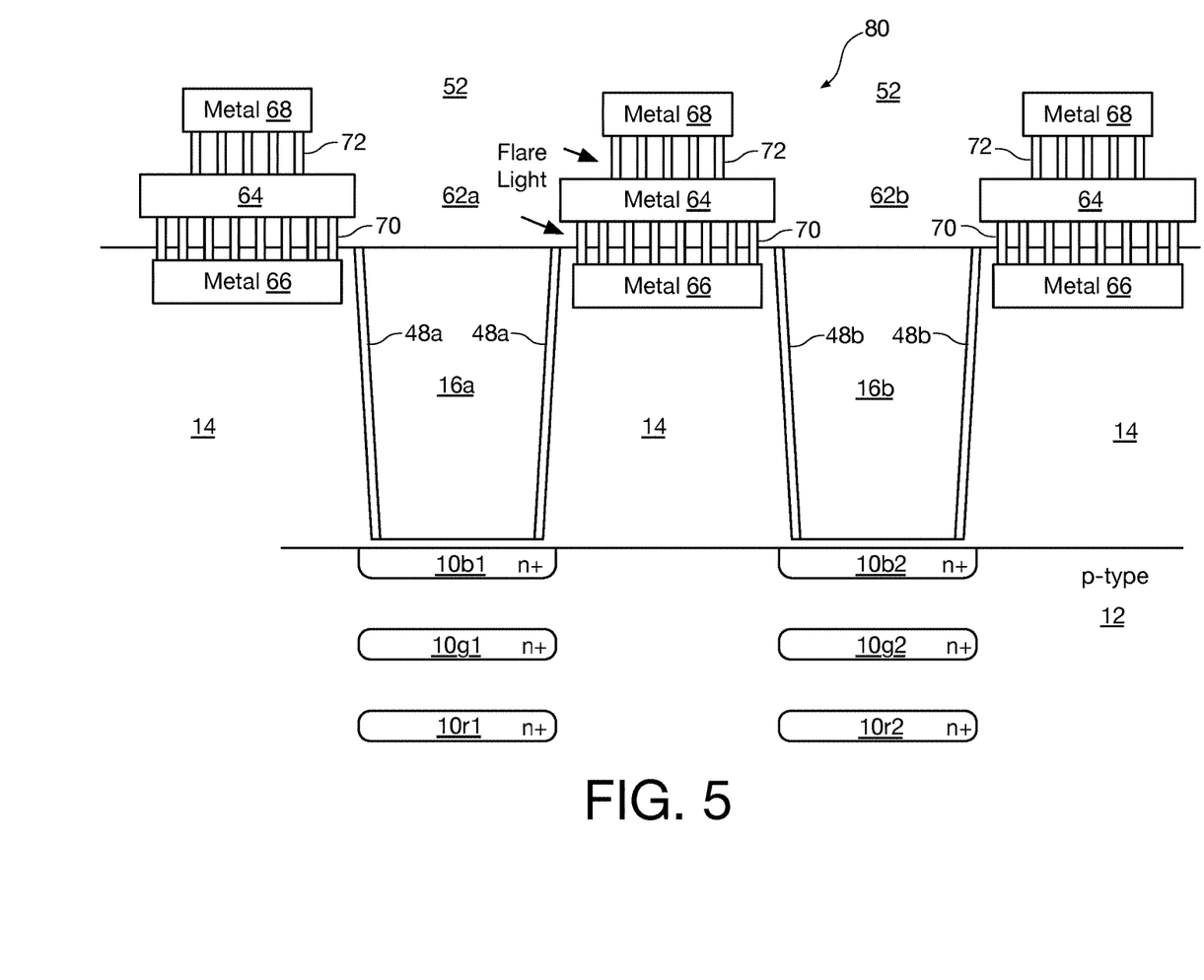
FIG. 5 is a cross sectional diagram of a portion of an imaging array including vertical color pixel sensors depicting a solution to the problem of capturing light impinging on the array at increased angles in accordance with an aspect of the present invention.

Referring now to FIG. 5, a cross sectional diagram of a portion 80 of a non-limiting example of an array of pixel sensors shows a pair of vertical color pixel sensors in accordance with one aspect of the present invention formed on a substrate 12 illustrates that the principles of the present invention are applicable to vertical color pixel sensors such as the X3® sensors from Foveon, Inc. of San Jose, Calif. Fabrication and use of such vertical color pixel sensors are known in the art. The embodiment shown in FIG. 5 is substantially similar to the embodiment depicted in FIG. 3, and elements of the portion 60 of the array of vertical pixel sensors in FIG. 5 that correspond to elements of the portion of the array of pixel sensors in FIG. 3 will be identified using the same reference numerals used in FIG. 3.

A first vertical color pixel sensor includes surface blue pixel sensor 10b1, buried green pixel sensor 10g1, and buried red pixel sensor 10r1. A second vertical color pixel sensor includes surface blue pixel sensor 10b2, buried green pixel sensor 10g2, and buried red pixel sensor 10r2. The substrate is shown in FIG. 5 as a p-type substrate and the vertical color pixel sensor including blue, green, and red pixel sensors 10b, 10g, and 10r are n-type regions disposed in the p-type substrate that form the anodes of photodiodes as is known in the art, the substrate forming the cathodes of the photodiodes. Persons of ordinary skill in the art will appreciate that the p-type substrate may be a p-well formed in an underlying semiconductor substrate.

The arrangement of elements in FIG. 5 above the substrate 12 of the portion 80 of the array is the same as the arrangement of elements in FIG. 3 above the substrate 12 of the portion 40 of the array depicted in FIG. 3 and the portion 60 of FIG. 4A and is disclosed with reference to the description of the embodiment of FIG. 3 and FIG. 4A.

Figure 6:
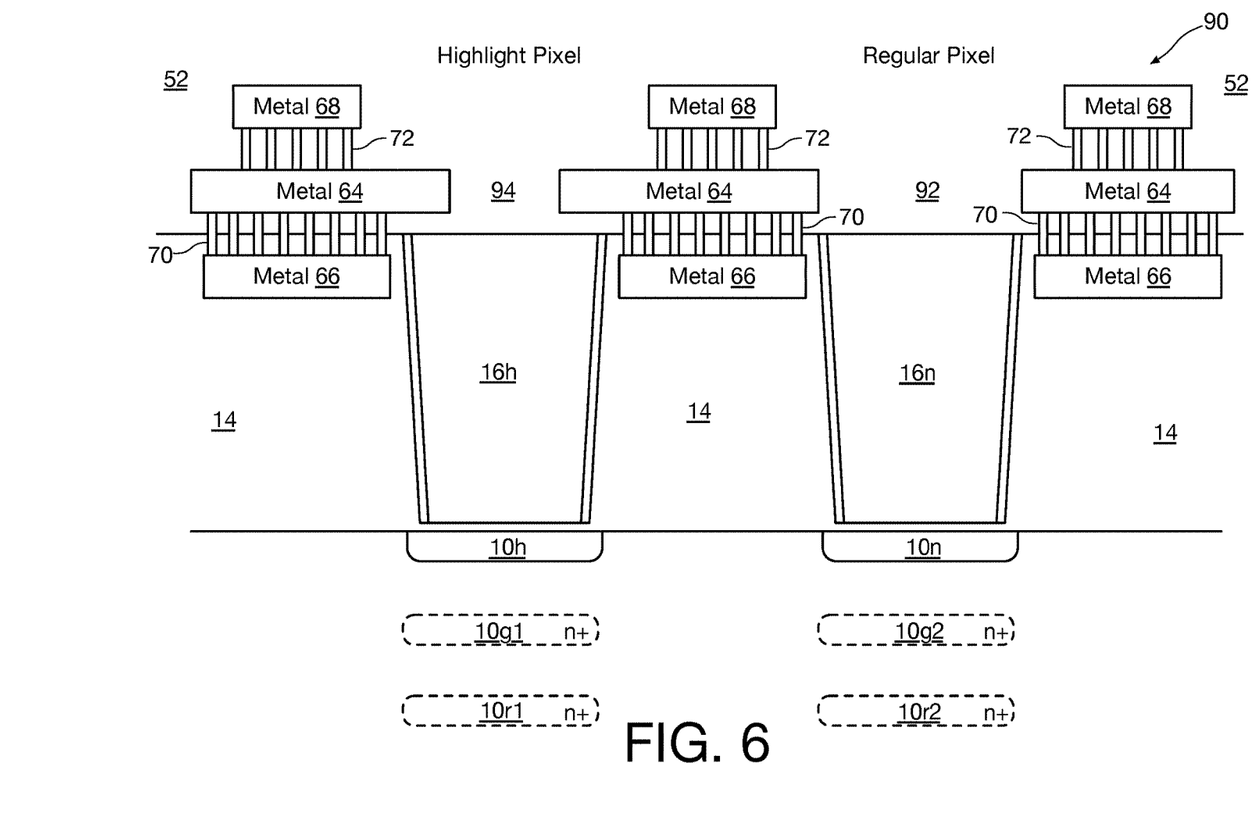
FIG. 6 is a cross sectional diagram of a portion of an imaging array illustrating an array including an illustrative reduced-sensitivity highlight pixel sensor in accordance with an embodiment of the present invention.

Referring now to FIG. 6, a cross-sectional view of an adjacent pair of pixel sensors and lightpipe structures illustrates portion 90 of an array including a normal pixel sensor 10n an illustrative reduced sensitivity highlight pixel sensor 10h in accordance with an embodiment of the present invention. The concept and use of highlight pixel sensors are disclosed in U.S. Pat. No. 9,191,556 issued on Nov. 17, 2015, incorporated herein by reference in its entirety. Persons of ordinary skill in the art will appreciate that while FIG. 6 shows a single surface pixel sensor, the illustrated highlight pixel concept applies to the vertical color pixel sensors disclosed herein.

The arrangement shown in FIG. 6 is substantially similar to FIG. 4A and FIG. 5 and will not be discussed in detail except to note the difference between a normal sensitivity pixel sensor 10n and a reduced sensitivity highlight pixel sensor 10h according to one aspect of the present invention. The array portion 90 shown in FIG. 6 is substantially similar to the embodiment depicted in FIG. 4A and FIG. 5, and elements of the portion 90 of the array of vertical pixel sensors in FIG. 6 that correspond to elements of the portion 40 of the array of pixel sensors in FIG. 4A and the portion 70 of the array of pixel sensors in FIG. 5 will be identified using the same reference numerals used in FIG. 5.

Over normal pixel 10n, which is configured as a normal pixel, the optical aperture 92 formed in the metal interconnect layer 64 over lightpipe 16n extends to a position aligned with the edges of the top of lightpipe 16b. Over reduced-sensitivity highlight pixel 10h, the optical aperture 94 formed in the metal interconnect layer 64 over lightpipe 16h extends over the edges of the top of lightpipe 16a, blocking a portion of light from entering the lightpipe 16a. The restricted optical aperture 94 formed by the edges of metal interconnect layer 64 results in a highlight pixel sensor 16a having less gain than pixel sensor 16b. As previously discussed, the vertical structures formed by the vias 70 and 72 between the metal interconnect layers 64 and 66 and 64 and 68, respectively, eliminate flare light from causing errors in the relative gain structures of the normal pixel sensors and the highlight pixel sensors in an array fabricated in accordance with this aspect of the present invention.

In accordance with one aspect of the present invention, an illustrative target range for the reduced sensitivity highlight pixel is typically about half to one-eighth of a normal pixel although persons of ordinary skill in the art will readily realize that other ranges may be used. For example, if the amount of light entering the pixel is cut to one quarter of the light entering a normal pixel, then the sensitivity would be approximately one-fourth that of the normal pixel. As will be readily appreciated by persons of ordinary skill in the art, the smaller the size of the aperture 92, the more light-sensitivity reduction is obtained.

While the use of vertical color pixel sensors is shown in FIG. 5 and FIG. 6, persons of ordinary skill in the art will readily understand that the principles of the present invention apply equally to single-color pixel sensors as well as vertical color pixel sensors and that no preference is intended between the two kinds of sensors in the various drawing figures and disclosed embodiments presented herein.

Figure 7:
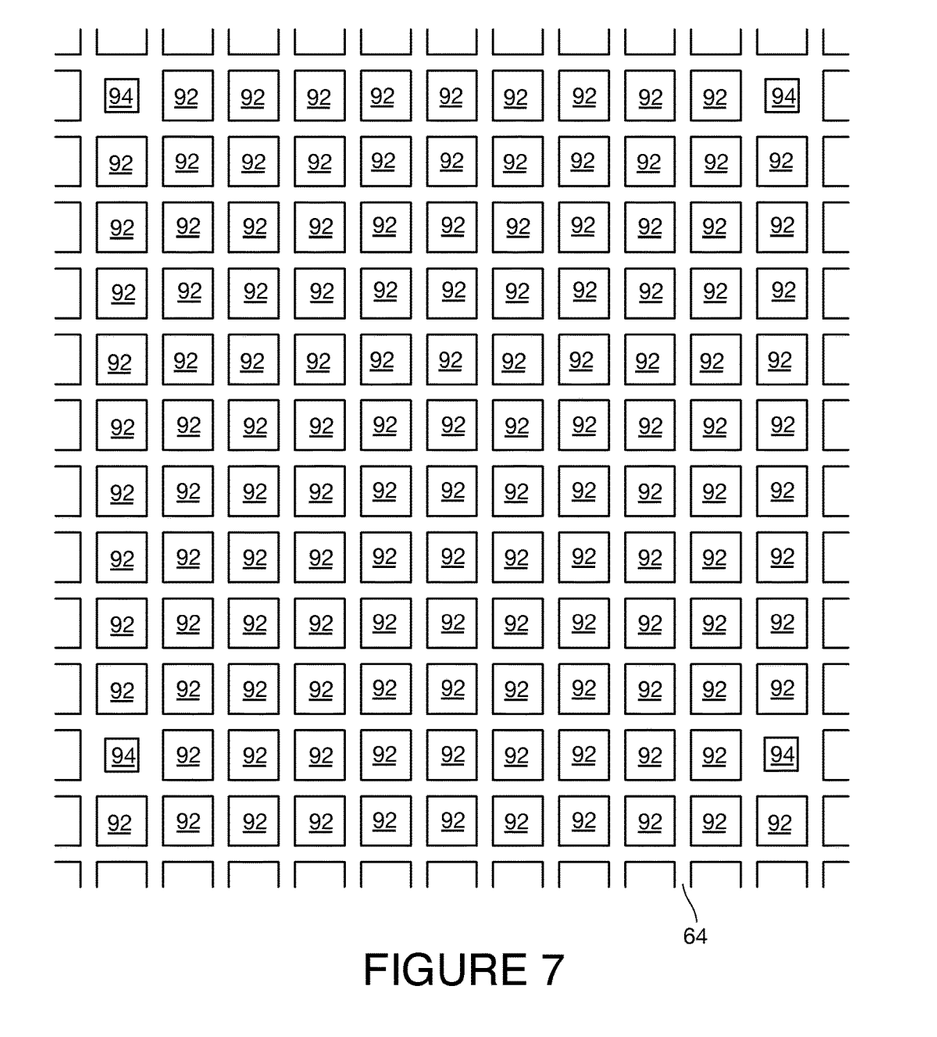
FIG. 7 is a diagram showing a portion of an illustrative pixel array according to the present invention including reduced-sensitivity highlight pixel sensors placed in a regular fashion in accordance with the present invention.

According to one aspect of the present invention illustrated in FIG. 7, the reduced sensitivity pixels 10h are placed in a regular fashion over the entire imaging array of regular pixels 10n. FIG. 7 is a top view of the metal layer 64 showing the layout of openings 92 and 94 to show an example of placement of highlight pixels. The non-limiting illustrative layout of FIG. 7 shows openings 94 for one highlight pixel 10h in every ten positions in both horizontal and vertical directions in an array. The reduced sensitivity pixels are spaced out so as to not compromise the overall quality of the image but to supplement the image processing for highlight data. Exemplary placement of the pixels according to the present invention is approximately every 2 to 100 pixels on a given row and column, but persons of ordinary skill in the art will appreciate that different spacings, such as periodic, pseudo-random, and random, could be employed. The result is that the reduced sensitivity pixels may account for between about 40% and about 0.01% of the total number of pixels. In one example, an arrangement including one reduced sensitivity pixel for every 10×10 pixel region. Persons of ordinary skill in the art will appreciate that an appropriate ratio can be selected depending on the size of the pixels and array.

Figure 8:
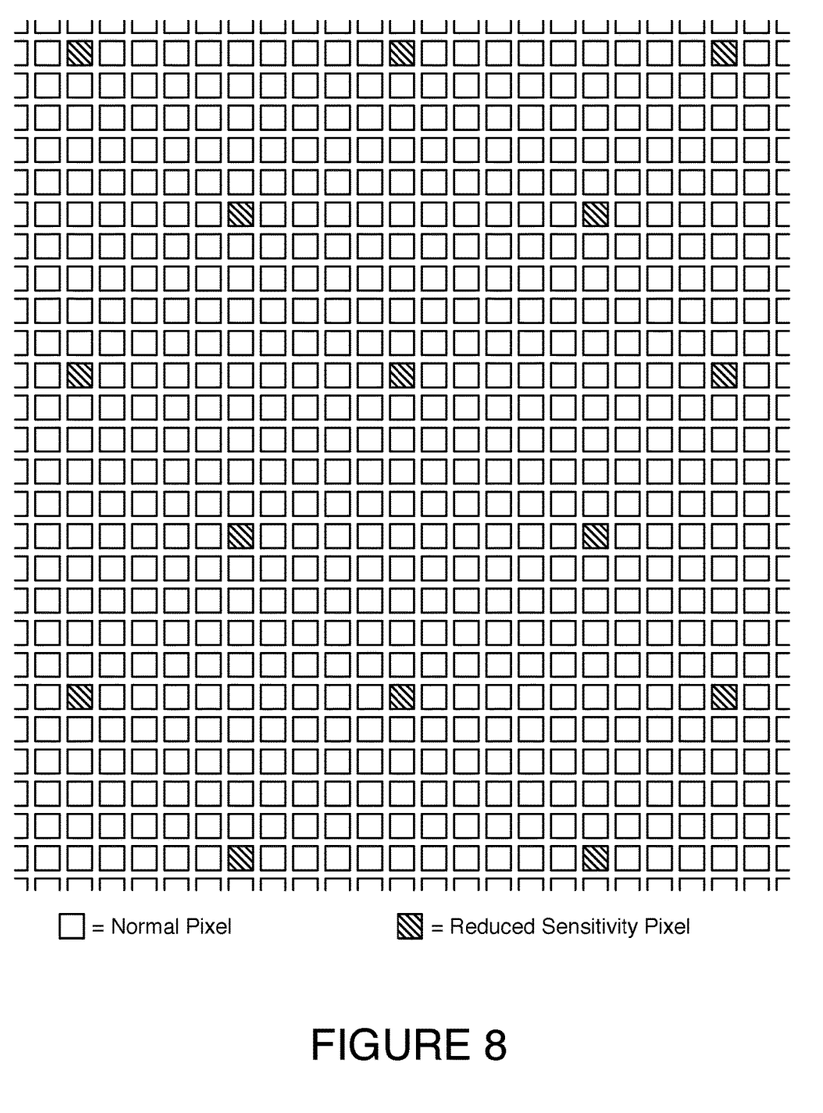
FIG. 8 is a diagram showing a portion of an illustrative pixel array according to the present invention including reduced-sensitivity highlight pixel sensors placed in regular fashion in a diamond pattern in accordance with the present invention.

According to one aspect of the present invention, the highlight pixels may be placed in a regular pattern in the imaging array, for example, the highlight pixels may be arranged in a diamond pattern as shown in FIG. 8. Generally, such a diamond pattern is created by first creating a regular pixel spacing and then adding a highlight pixel in a center of a square of four existing regular pixels. As a non-limiting example of another arrangement shown in FIG. 8, the highlight pixels may be placed every tenth pixel both horizontally and vertically, and every fifth pixel diagonally.

Figure 9A:
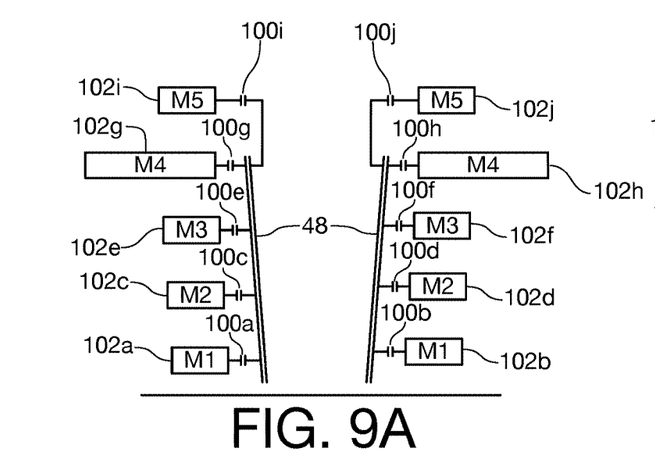
FIG. 9A is a cross sectional diagram of a portion of an imaging array depicting the problem of unwanted signal coupling between the reflective lining layer and metal interconnect segments in the integrated circuit containing the pixel sensor array.

Referring now to FIG. 9A, a simplified cross-sectional diagram of a lightpipe structure illustrates the problem of coupling of stray capacitances due to the relatively large surface area of the reflective liner identified by reference numeral 48. The metal liner 48 acts as one plate of parasitic capacitances to other metal segments in the interconnect structure of the integrated circuit. Stray capacitances are shown in FIG. 9A as capacitors 100*a* through 100 *j* that respectively couple between the reflective liner 48 and metal interconnect segments 102*a* through 102*j* on the M1 through M5 levels of metal interconnect in the integrated circuit.

Figure 9B:
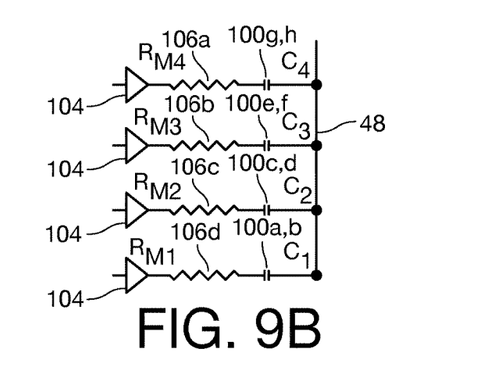
FIG. 9B is a simplified equivalent electrical circuit diagram of the portion of the imaging array depicted in FIG. 9A.

The metal line segments 102*a* through 102*j* carry digital or analog signals and switch between high and low logic states or between different analog voltages. As shown in FIG. 9B, capacitances 6100*a* through 100*j* parasitically couple the digital and analog voltage changes to the reflective liner and to other ones of the metal line segments 102*a* through 102*j*. Each path can be represented by a series RC circuit coupled between one power supply potential represented by an amplifier 104 and the reflective liner 48, where reference numerals 106*a* through 106*d* represent the resistance of the respective metal lines.

Figure 10A:
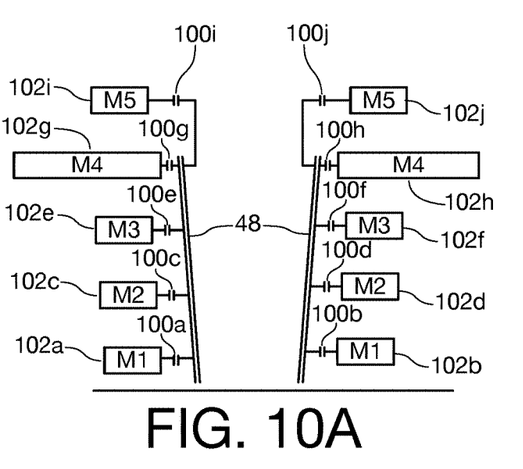
FIG. 10A is a cross sectional diagram of a portion of an imaging array depicting a solution to the problem of unwanted signal coupling between the reflective lining layer and metal interconnect segments in the integrated circuit containing the pixel sensor array.
Figure 10B:
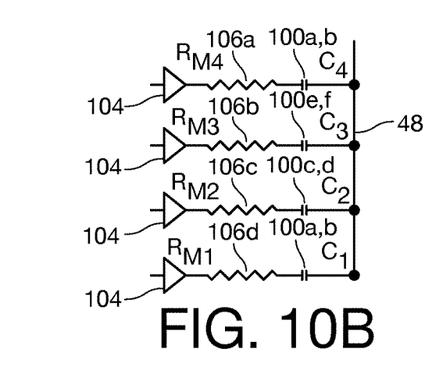
FIG. 10B is a simplified equivalent electrical circuit diagram of the portion of the imaging array depicted in FIG. 10A.

FIGS. 10A and 10B illustrate a solution to the problem of parasitic signal coupling shown in FIGS. 9A and 9B. The metal interconnect level M4 is designated as a DC power bus. M4 may be formed as a very wide metal, essentially a metal sheet having apertures formed around the light pipes. The M4 metal layer may also be located closer to the reflective liner 48 than the metal segments of the other metal layers M1 through M3.

By forming the M4 layer as a large sheet, its resistance path to the power supply ground is much less than the resistances of the other metal interconnect segments to the power supply ground ($R_{M4} \ll R_{M1}, R_{M2}, R_{M3}$). By locating the metal layer M4 closer to the reflective liner 48 than the metal interconnect segments of the other metal layers M1 through M3, the coupling capacitance between it and the metal liner 48 is much larger than the coupling capacitances between the metal interconnect segments of the other metal layers M1 through M3 and the metal liner 48 ($C_4$ (100*a* and 100*b*)$\gg C_1, C_2, C_3$), thus providing a much lower impedance path from the metal liner 48 to the power supply ground than to the other metal line segments M1 through M3, thus shunting more of the parasitic signals coupled into the metal liner 48 to ground rather than into the other signal carrying metal interconnect segments.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A pixel sensor array formed on a substrate, the pixel sensor array comprising:
   a plurality of surface pixel sensors formed at a surface of the substrate;
   a layer of dielectric material formed over the surface of the substrate;
   a plurality of apertures formed in the dielectric layer, each aperture aligned with one of the surface pixel sensors, each aperture having an inner side wall;
   a reflective lining layer formed on the inner side wall of each aperture, the lining layer being substantially fully reflective to visible light, an inner wall of each reflective lining layer spaced apart from the surface of the substrate and having a smaller cross-sectional area than a cross-sectional area of each surface pixel sensor, the inner wall of each reflective lining layer lying in a plane with a top surface of the layer of dielectric material;
   a filler material disposed in each aperture inside of the reflective lining layer and having a top surface lying in the plane with the top surface of the layer of dielectric material, the filler material being substantially transparent to visible light; and
   a microlens disposed over the top surface of each aperture.

2. The pixel sensor array of claim 1 wherein:
   the substrate is a layer of silicon doped with a dopant species having a first conductivity type; and
   each surface pixel sensor comprises a photodiode formed at the surface of the substrate, each photodiode having an anode formed from a region of silicon doped with a dopant species having a second conductivity type opposite the first conductivity type.

3. The pixel sensor array of claim 1 further comprising:
   at least one subsurface pixel sensor disposed in the substrate below, in alignment with, and insulated from the surface pixel sensor.

4. The pixel sensor array of claim 3 wherein:
   the at least one subsurface pixel sensor comprises:
   a first subsurface pixel sensor disposed in the substrate below, in alignment with, and insulated from the surface pixel sensor; and
   a second subsurface pixel sensor disposed in the substrate below, in alignment with, and insulated from the first subsurface pixel sensor.

5. The pixel sensor array of claim 1 wherein the reflective lining layer is formed from an Al—Cu metal layer.

6. The pixel sensor array of claim 1 wherein the filler material is formed from a polymer.

7. The pixel sensor array of claim 1 wherein the filler material is formed from a dielectric material.

8. The pixel sensor array of claim 1 wherein the dielectric material is silicon dioxide.

9. The pixel sensor array of claim 1 wherein the inner wall of each reflective lining layer is tapered from a larger cross-sectional area at the top surface thereof to a smaller cross-sectional area at a bottom surface thereof.

10. The pixel sensor array of claim 1 wherein each aperture is aligned with one of the surface pixel sensors within a predetermined tolerance.

11. The pixel sensor array of claim 1 wherein the inner wall of each reflective lining layer spaced apart from the surface of the substrate by a distance selected to allow not more than 1% of light to fall outside the active pixel sensor area.

12. The pixel sensor array of claim 1, further comprising:
a vertical structure disposed between each adjacent pair of the pixel sensors and forming entrance apertures for light to pass into the pixel sensors, each vertical structure including
segments of a first metal interconnect layer positioned below a top surface of the reflective lining layers of the adjacent ones of the pixel sensors;
segments of a second metal interconnect layer positioned above a top surface of the reflective lining layers of the adjacent ones of the pixel sensors;
segments of a third metal interconnect layer d positioned above the segments of the second metal interconnect layer;
a plurality of first metal interconnect vias disposed between segments of the first metal interconnect layer and the second metal interconnect layer;
a plurality of second metal interconnect vias disposed between segments of the second metal interconnect layer and the third metal interconnect layer;
the plurality of first and second metal interconnect vias laterally positioned with respect to one another to block flare light from passing through any of the vertical structures.

13. The pixel sensor array of claim 12 wherein the plurality of first and second metal interconnect vias are arranged in rows, metal interconnect vias in adjacent rows being offset from one another.

14. The pixel sensor array of claim 12, wherein:
segments of the second metal interconnect layer disposed between first adjacent pairs of the pixel sensors are spaced apart by a distance to form first pixel sensors having apertures having a first area; and
segments of the second metal interconnect layer disposed between second adjacent pairs of the pixel sensors are spaced apart by a distance to form second pixel sensors having apertures having a second area smaller than the first area, the apertures having a second area being fewer in number than the apertures having the first area.

15. The pixel sensor array of claim 14 wherein the apertures of the second pixel sensors are chosen to admit from between about one-eighth to about one-half the light admitted by apertures of the first pixel sensors.

16. The pixel sensor array of claim 14 wherein the second pixel sensors are placed from every 2 to every 100 pixels on a given row and column of the array.

17. The pixel sensor array of claim 14 wherein the second pixel sensors are distributed in a regular pattern across the entire imaging array.

18. The pixel sensor array of claim 16 wherein the second pixel sensors are distributed in a diamond pattern across the imaging array.

* * * * *